United States Patent
Lin et al.

(10) Patent No.: US 8,802,579 B2
(45) Date of Patent: Aug. 12, 2014

(54) SEMICONDUCTOR STRUCTURE AND FABRICATION METHOD THEREOF

(75) Inventors: Chien-Liang Lin, Taoyuan County (TW); Shao-Wei Wang, Taichung (TW); Yu-Ren Wang, Tainan (TW); Ying-Wei Yen, Miaoli County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 62 days.

(21) Appl. No.: 13/271,256

(22) Filed: Oct. 12, 2011

(65) Prior Publication Data

US 2013/0093064 A1    Apr. 18, 2013

(51) Int. Cl.
*H01L 21/31*   (2006.01)
*H01L 21/28*   (2006.01)
*H01L 21/02*   (2006.01)
*H01L 29/51*   (2006.01)
*H01L 29/66*   (2006.01)
*H01L 29/49*   (2006.01)

(52) U.S. Cl.
CPC ..... *H01L 21/02181* (2013.01); *H01L 29/66545* (2013.01); *H01L 21/28194* (2013.01); *H01L 21/0234* (2013.01); *H01L 21/02332* (2013.01); *H01L 21/0228* (2013.01); *H01L 29/4966* (2013.01); *H01L 29/517* (2013.01); *H01L 29/513* (2013.01); *H01L 21/02337* (2013.01); *H01L 21/28185* (2013.01)
USPC ................. 438/785; 438/761; 257/E21.477

(58) Field of Classification Search
USPC ................... 257/E21.191, E21.457
See application file for complete search history.

(56) References Cited

U.S. PATENT DOCUMENTS

| | | |
|---|---|---|
| 5,498,768 A | 3/1996 | Nishitani |
| 6,063,698 A | 5/2000 | Tseng |
| 6,251,761 B1 | 6/2001 | Rodder |
| 6,380,104 B1 | 4/2002 | Yu |
| 6,492,217 B1 | 12/2002 | Bai |
| 6,642,066 B1 | 11/2003 | Halliyal |
| 6,656,852 B2 | 12/2003 | Rotondaro |
| 6,696,345 B2 | 2/2004 | Chau |
| 6,818,517 B1 | 11/2004 | Maes |
| 6,818,553 B1 | 11/2004 | Yu |
| 6,841,484 B2 | 1/2005 | Ying |
| 6,921,711 B2 | 7/2005 | Cabral, Jr. |
| 7,012,027 B2 | 3/2006 | Perng |
| 7,030,430 B2 | 4/2006 | Doczy |
| 7,126,199 B2 | 10/2006 | Doczy |
| 7,135,361 B2 | 11/2006 | Visokay |
| 7,157,378 B2 | 1/2007 | Brask |
| 7,160,767 B2 | 1/2007 | Brask |

(Continued)

OTHER PUBLICATIONS

Hokyung Park, "The Effect of Nanoscale Nonuniformity of Oxygen Vacancy on Electrical and Reliability Characteristics of HfO2 MOSFET Devices", IEEE Electron Device Letters, Vol. 29, No. 1, Jan. 2008.

*Primary Examiner* — Cheung Lee
(74) *Attorney, Agent, or Firm* — Winston Hsu; Scott Margo

(57) ABSTRACT

A semiconductor process includes the following steps. A substrate is provided. A dielectric layer having a high dielectric constant is formed on the substrate, wherein the steps of forming the dielectric layer include: (a) a metallic oxide layer is formed; (b) an annealing process is performed to the metallic oxide layer; and the steps (a) and (b) are performed repeatedly. Otherwise, the present invention further provides a semiconductor structure formed by said semiconductor process.

17 Claims, 5 Drawing Sheets

(56) References Cited

U.S. PATENT DOCUMENTS

| | | |
|---|---|---|
| 7,208,366 B2 | 4/2007 | Tsai |
| 7,371,649 B2 | 5/2008 | Cheng |
| 7,381,608 B2 | 6/2008 | Brask |
| 7,384,880 B2 | 6/2008 | Brask |
| 7,488,656 B2 | 2/2009 | Cartier |
| 7,501,336 B2 | 3/2009 | Doyle |
| 7,521,324 B2 | 4/2009 | Ohmi |
| 7,601,648 B2 | 10/2009 | Chua |
| 7,824,990 B2 | 11/2010 | Chang |
| 2004/0007561 A1 | 1/2004 | Nallan |
| 2005/0202624 A1 | 9/2005 | Li |
| 2005/0260357 A1* | 11/2005 | Olsen et al. ............ 427/569 |
| 2005/0275035 A1 | 12/2005 | Mathew |
| 2006/0054943 A1 | 3/2006 | Li |
| 2006/0094192 A1 | 5/2006 | Yang |
| 2006/0153995 A1* | 7/2006 | Narwankar et al. ........... 427/569 |
| 2006/0172548 A1 | 8/2006 | Wu |
| 2006/0211259 A1 | 9/2006 | Maes |
| 2006/0284271 A1 | 12/2006 | Doyle |
| 2008/0070395 A1* | 3/2008 | Yen et al. ................ 438/591 |
| 2008/0157231 A1 | 7/2008 | Wang |
| 2008/0318442 A1* | 12/2008 | Ogawa et al. .............. 438/785 |
| 2009/0057787 A1 | 3/2009 | Matsuki |
| 2009/0179283 A1 | 7/2009 | Adams |
| 2010/0035423 A1 | 2/2010 | Clark |
| 2010/0062592 A1 | 3/2010 | Clark |
| 2010/0068877 A1 | 3/2010 | Yeh |
| 2010/0075507 A1 | 3/2010 | Chang |
| 2010/0081262 A1 | 4/2010 | Lim |
| 2010/0184281 A1 | 7/2010 | Hsu |
| 2010/0219481 A1 | 9/2010 | Tseng |

* cited by examiner

SEMICONDUCTOR STRUCTURE AND FABRICATION METHOD THEREOF

BACKGROUND OF THE INVENTION

1. Field of the Invention

The present invention relates generally to a semiconductor structure and fabrication method thereof, and more specifically, to a semiconductor structure and fabrication method thereof, including multi-layers of dielectric layer having a high dielectric constant with discontinuous boundaries.

2. Description of the Prior Art

Poly-silicon is conventionally used as a gate electrode in semiconductor devices, such as the metal-oxide-semiconductor (MOS). With the trend towards scaling down the size of semiconductor devices, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-K gate dielectric layer are used to replace the conventional poly-silicon gate to be the control electrode.

As the semiconductor process is miniaturized and the size of the semiconductor device shrinks, the thickness of the gate dielectric layer having a high dielectric constant needs to be thinner for achieving the desired performance. As the thickness of the gate dielectric layer decreases, however, leakage current of the gate increases. Therefore, methods for solving current leakage are needed in the industry that can reduce gate leakage current density (Jg) while maintaining equivalent oxide thickness (EOT) of the gate.

SUMMARY OF THE INVENTION

The present invention provides a semiconductor structure and fabrication method thereof, which has multiple dielectric layers having a high dielectric constant with discontinuous boundaries, for reducing gate leakage current density (Jg).

The present invention provides a semiconductor process including the following steps. A substrate is provided. A dielectric layer having a high dielectric constant is formed on the substrate, wherein the steps of forming the dielectric layer having a high dielectric constant include: (a) forming a metallic oxide layer; (b) performing an annealing process on the metallic oxide layer; and performing the steps of (a) and (b) repeatedly.

The present invention provides a semiconductor structure including a substrate and a dielectric layer having a high dielectric constant. The dielectric layer having a high dielectric constant is disposed on the substrate, wherein the dielectric layer having a high dielectric constant includes a plurality of metallic oxide layers and an annealing interface is between each of the metallic oxide layers.

The present invention provides a semiconductor structure and fabrication method thereof, which forms a plurality of stacked metallic oxide layers to form a dielectric layer having a high dielectric constant, and performs an annealing process after each of the metallic oxide layers is formed, therefore the dielectric layer having a high dielectric constant has multiple layers with discontinuous boundaries, so that the gate leakage current is restrained to flowing downward and the gate leakage current density (Jg) therefore reduces.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
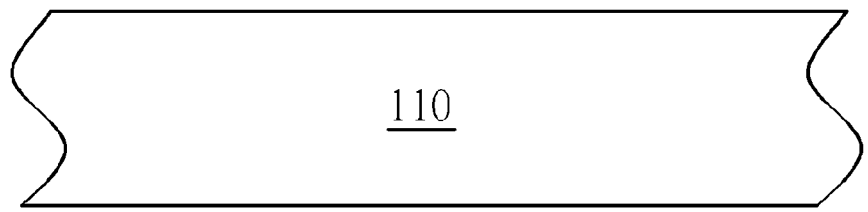
FIGS. 1-4 schematically depict a cross-sectional view of a semiconductor process according to one preferred embodiment of the present invention.

FIGS. 1-4 schematically depict a cross-sectional view of a semiconductor process according to one preferred embodiment of the present invention. A semiconductor process includes the following steps. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A pre-cleaning process (not shown) is selectively performed to clean the surface of the substrate 110, wherein the pre-cleaning process may be a Standard Clean 1 (SC1) process or a Standard Clean 2 (SC2) process, but is not limited thereto. A buffer layer (not shown) is selectively formed on the substrate 110. The buffer layer may be an oxide layer, which may be formed by a thermal oxide process, etc.

Figure 2:
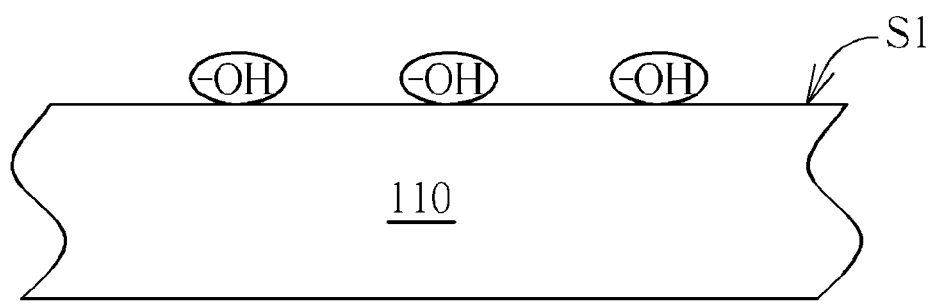
Figure 3:
Figure 3:
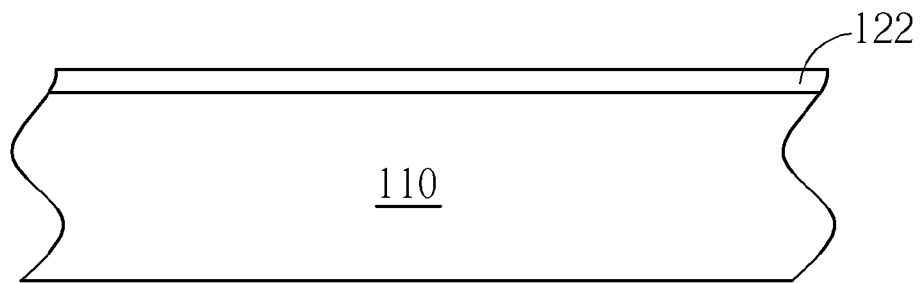
Figure 4:
Figure 4:
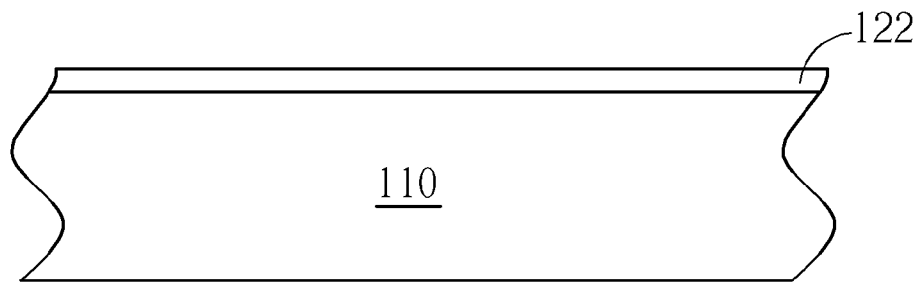

As shown in FIGS. 2-4, a metallic oxide layer 122 is formed on the substrate 110. In this embodiment, the steps of forming the metallic oxide layer 122 may include, but are not limited to, the following steps. As shown in FIG. 2, an oxygen containing process P1 is performed to provide OH-bonds, therefore the surface S1 of the substrate 110 has OH-bonds. The oxygen containing process P1 may include a vapor importing process, a chloridizing and water importing process, a decoupled plasma oxidation and water importing process or an ozone importing process etc. In one embodiment, the vapor importing process may include: water is imported in a chamber, and then the water phase transforms into vapor due to the temperature in the chamber. In a preferred embodiment, the processing time of the vapor importing process is 10 seconds for providing enough OH-bonds on the surface S1 of the substrate 110 during processing time. As shown in FIG. 3, a deposition process P2 is performed to form the metallic oxide layer 122. The metallic oxide layer 122 may include the group selected from hafnium oxide (Hf02), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and bariumstrontiumtitanate (BaxSr1-xTiO3, BST), but is not limited thereto. The metallic oxide layer 122 is a hafnium oxide layer in this embodiment. The deposition process P2 for forming the hafnium oxide layer may include, but is not limited to: hafnium tetrachloride and water are imported at the same time to form the hafnium oxide layer; or, hafnium tetrachloride and water are imported in turn to form the hafnium oxide layer.

As shown in FIGS. 2-3, the oxygen containing process P1 and the deposition process P2 are performed to form the metallic oxide layer 122. In another embodiment, the methods of forming the metallic oxide layer 122 may include performing an atomic layer deposition (ALD) process. Furthermore, before the atomic layer deposition process is performed, a treatment process, such as a pre-atomic layer deposition (ALD) treatment process, may be performed. In one case, the pre-atomic layer deposition (ALD) treatment process may be a Standard Clean 1 (SC1) process.

As shown in FIG. 4, an annealing process P3 is performed on the metallic oxide layer 122, wherein the annealing process P3 may include an oxygen containing annealing process or a nitrogen containing annealing process. In a preferred embodiment, the annealing process P3 is an oxygen containing annealing process, which can repair the oxygen vacancies in the metallic oxide layer 122 and improve the structural quality of the metallic oxide layer 122. The annealing process P3 may include an oxygen containing annealing process and a nitrogen containing annealing process. Preferably, the nitrogen containing annealing process is performed and then the oxygen containing annealing process is performed. In doing this, the oxygen atoms imported during the oxygen containing annealing process will not diffuse into layers below the metallic oxide layer 122 such as the buffer layer, that increases the equivalent oxide thickness (EOT) of the layers.

Figure 5:
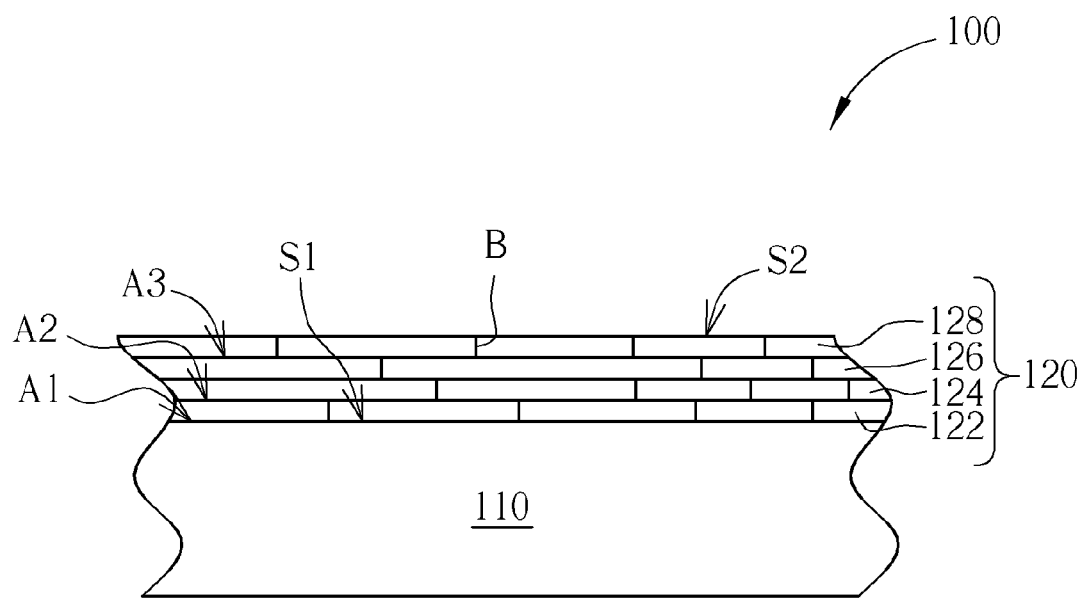
FIG. 5 schematically depicts a cross-sectional view of a semiconductor structure according to one preferred embodiment of the present invention.

As shown in FIG. 5, the steps of FIG. 2-4 are performed repeatedly to form a dielectric layer having a high dielectric constant 120 on the substrate 110, wherein the dielectric layer having a high dielectric constant 120 includes multi-layers formed by metallic oxide layers 122, 124, 126 and 128. For clarifying the present invention, the dielectric layer having a high dielectric constant 120 is a four-layered structure formed by metallic oxide layers 122, 124, 126 and 128, but it is not limited thereto. In a preferred embodiment, the steps of FIG. 2-4 are performed more than 20~25 cycles to form at least 20~25 layers of metallic oxide layers.

An annealing process P3 is independently performed after every metallic oxide layers (such as the aforesaid metallic oxide layers 122, 124, 126 and 128) is formed in the present invention. In doing this, annealing interfaces A1, A2 and A3 are respectively formed between each of the metallic oxide layers 122, 124, 126 and 128, therefore the boundaries B of metallic oxide layers 122, 124, 126 and 128 are discontinuous. The paths of boundaries that conductive carriers pass along are broken because of the discontinuous boundaries B, so gate leakage current is restrained, and gate leakage current density (Jg) therefore decreases. In a preferred embodiment, the annealing process P3 is an oxygen containing annealing process, which can reduce gate leakage current density (Jg) without increasing the equivalent oxide thickness (EOT) of the gate. In a still preferred embodiment, the annealing process P3 includes an oxygen containing annealing process and a nitrogen containing annealing process, wherein the nitrogen containing annealing process is performed before the oxygen containing annealing process is performed. In doing this, the annealing process P3 can not only have the advantages of performing the oxygen containing annealing process, but also avoid the oxygen atoms imported during the oxygen containing annealing process from diffusing into layers below the metallic oxide layer 122, that increases the equivalent oxide thickness (EOT) of the layers. When the annealing temperature of the oxygen containing annealing process or the nitrogen containing annealing process is too high, the metallic oxide layers 122, 124, 126 and 128 will re-crystallize. In contrast, when the annealing temperature of the oxygen containing annealing process or the nitrogen containing annealing process is too low, the oxygen vacancies of the metallic oxide layers 122, 124, 126 and 128 will be hard to repair or the metallic oxide layers 122, 124, 126 and 128 will be hard to nitridized. In a preferred embodiment, the processing temperatures of the oxygen containing annealing process and the nitrogen containing annealing process are 200° C.~300° C.

The process of forming the dielectric layer having a high dielectric constant 120 of the present invention is an in-situ process. That is, the steps of forming the metallic oxide layers 122, 124, 126 and 128 and performing the corresponding annealing process P3 are preferably performed in the same chamber. Thus, the reaction of the substrate 110 or the metallic oxide layers 122, 124, 126 and 128 with the ingredients of the atmosphere such as vapor can be avoided, which would increase an equivalent oxide thickness (EOT) of the dielectric layer having a high dielectric constant 120.

The semiconductor process of the present invention can form a semiconductor structure 100. FIG. 5 schematically depicts a cross-sectional view of a semiconductor structure according to one preferred embodiment of the present invention. The semiconductor structure 100 includes a substrate 110 and a dielectric layer having a high dielectric constant 120. The dielectric layer having a high dielectric constant 120 includes a plurality of metallic oxide layers 122, 124, 126 and 128. Annealing interfaces are respectively located between each of the metallic oxide layers 122, 124, 126 and 128. The boundaries B of each metallic oxide layers 122, 124, 126 and 128 are discontinuous. Therefore, semiconductor structure 100 has a lower gate leakage current density (Jg) than the semiconductor structure of the prior art.

After the semiconductor structure 100 of the present invention is formed, a nitridation process (not shown) may be performed on all of the stacked metallic oxide layers, to nitride the surface S2 of the dielectric layer having a high dielectric constant 120, so that the dielectric constant of the dielectric layer having a high dielectric constant 120 increases. In a preferred embodiment, the nitridation process is a decoupled plasma nitridation process, which makes it easier to control the distribution of the implanting nitrogen atoms of the dielectric layer 120, thereby making the implanting nitrogen atoms distribute in the surface S2 of the dielectric layer 120 without diffusing downward to the substrate 110. After the nitridation process is performed, a post deposition annealing process (not shown) may be performed to repair defects of dielectric layer having a high dielectric constant 120, wherein the post deposition annealing process may include an oxygen containing annealing process, wherein the processing temperature is 900° C.

The semiconductor process and its resulting formed semiconductor structure 100 is suitable for use in various semiconductor components. A transistor process applying the semiconductor process of the present invention is provided in the following to further illustrate the present invention, but the present invention is not restricted to this process alone.

Figure 6:
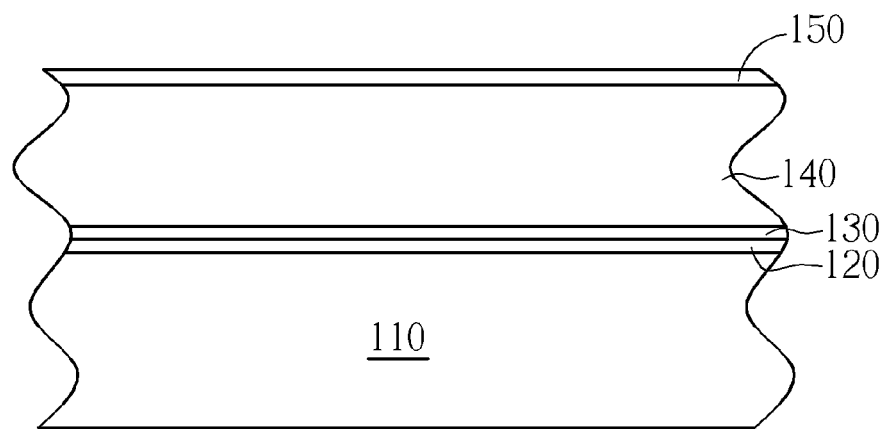
FIGS. 6-10 schematically depict a cross-sectional view of a transistor process according to one preferred embodiment of the present invention, which applies the semiconductor process of the present invention.

After the dielectric layer having a high dielectric constant 120 is formed on the substrate 110, a transistor process can be sequentially performed as shown in FIGS. 6-10. FIGS. 6-10 schematically depict a cross-sectional view of a transistor process according to one preferred embodiment of the present invention, which applies the semiconductor process of the present invention. As shown in FIG. 6, a barrier layer 130 is formed on the dielectric layer having a high dielectric constant 120 to prevent metals formed on the barrier layer 130 in the following processes from diffusing to the dielectric layer having a high dielectric constant 120. The barrier layer 130 may include a titanium nitride layer or a tantalum nitride layer etc. As the barrier layer 130 is a titanium nitride layer in this example, the thickness of the barrier layer 130 may be 20 angstroms, to make it have the capability of a barrier, but the present invention is not limited thereto. A sacrificed electrode layer 140 is formed on the barrier layer 130, wherein the sacrificed electrode layer 140 may be a polysilicon layer. A cap layer 150 is formed on the sacrificed electrode layer 140, wherein the cap layer 150 may include a nitride layer.

Figure 7:
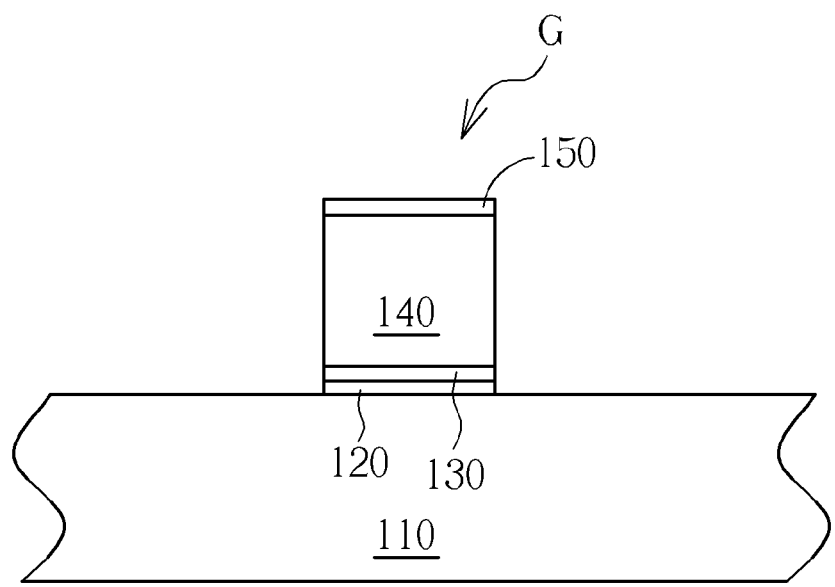
Figure 8:
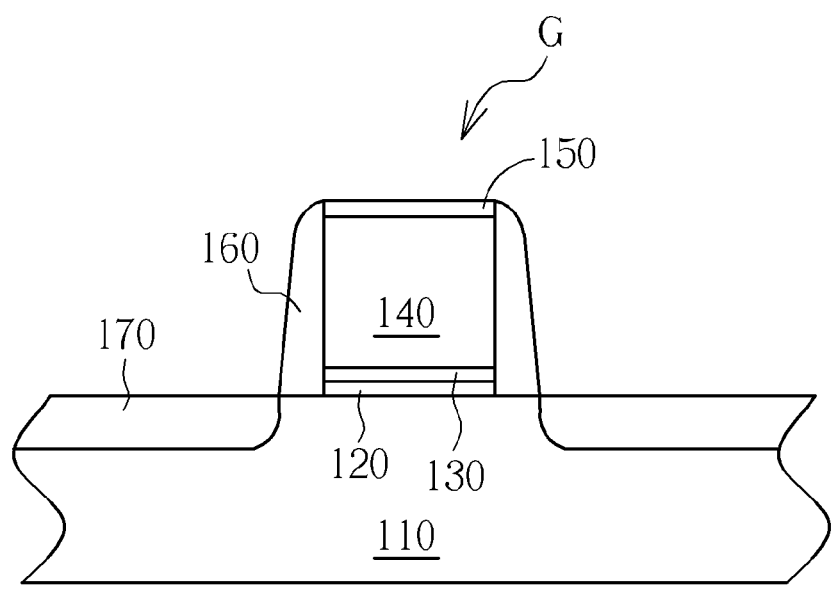

As shown in FIG. 7, the cap layer 150, the sacrificed electrode layer 140, the barrier layer 130 and the dielectric layer having a high dielectric constant 120 are sequentially patterned to form a sacrificed gate G. As shown in FIG. 8, a spacer 160 is formed beside the sacrificed gate G, therefore the source/drain region 170 can be automatically aligned and formed in the substrate 110 besides the spacer 160.

Figure 9:
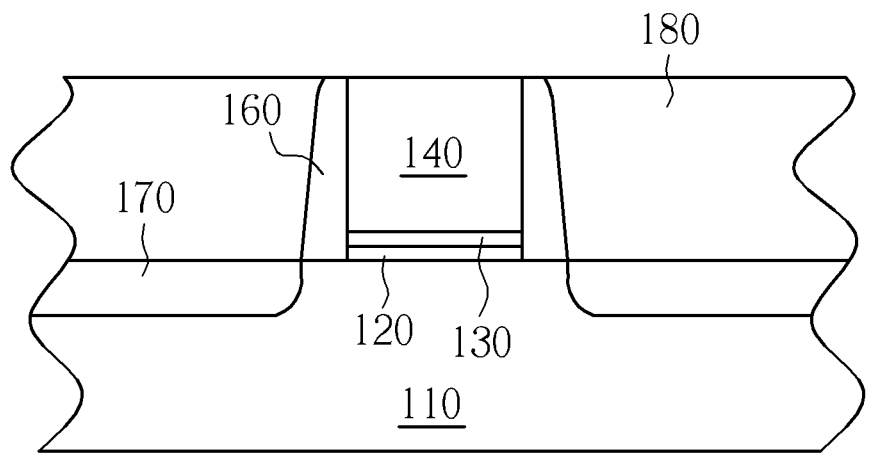
Figure 10:
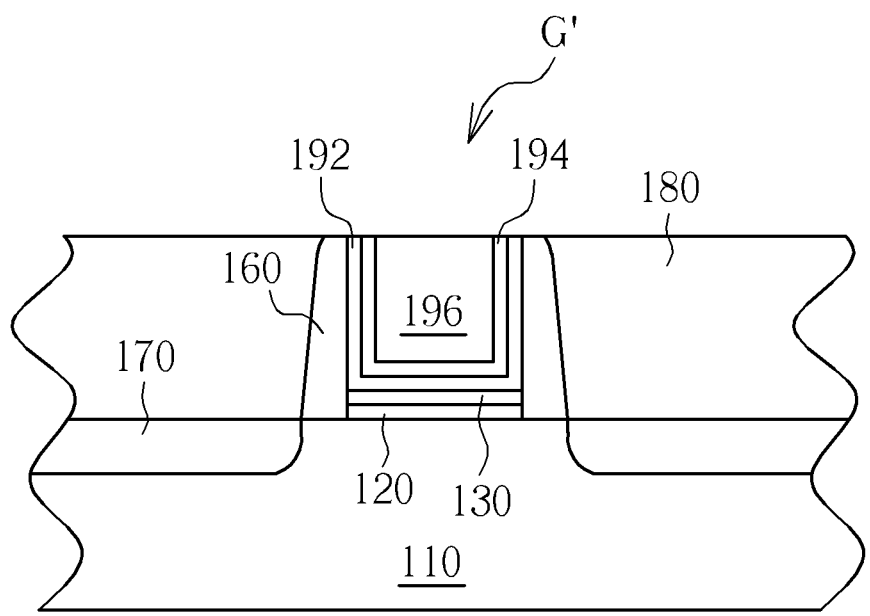

As shown in FIG. 9, an interdielectric layer 180 is formed and polished to expose the sacrificed electrode layer 140. As shown in FIG. 10, a gate-last for high-k first process may be performed to remove the sacrificed electrode layer 140 and sequentially fill a work function metal layer 192, a stop layer 194 and a metal electrode layer 196, so that a metal gate G' can be formed.

The gate-last for high-k first process is applied in this embodiment, so that the dielectric layer having a high dielectric constant 120 is formed before the sacrificed gate G is formed. In addition, a gate-last for high-k last process or a gate-first process may also be applied in the present invention. As the gate-first process is applied, the order of forming the dielectric layer having a high dielectric constant 120 is the same as in this embodiment, but the metal electrode layer is directly formed without forming the sacrificed electrode layer 140. Otherwise, as the gate-last for high-k last process is applied, the dielectric layer having a high dielectric constant 120, which includes an annealing process independently performed after every metallic oxide layers is formed, is formed after a gate trench is formed. The methods of forming metal gates are known in the art, and therefore not described herein.

To summarize, the present invention provides a semiconductor structure and fabrication method thereof, which forms a plurality of stacked metallic oxide layers to form a dielectric layer having a high dielectric constant, and performs an annealing process after every metallic oxide layers is formed to respectively form an annealing interface between each of the metallic oxide layers. In this way, the semiconductor structure of the present invention has a dielectric layer having a high dielectric constant comprising multi-layers structure with discontinuous boundaries, so that gate leakage current flowing downward is restrained and the gate leakage current density (Jg) is therefore reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
providing a substrate;
forming a dielectric layer having a high dielectric constant on the substrate, wherein the steps of forming the dielectric layer having a high dielectric constant comprise repeatedly performing the following steps:
(a) forming a metallic oxide layer;
(b) performing an annealing process comprising an oxygen containing annealing process to the metallic oxide layer right after the metallic oxide layer is formed; and
performing a nitridation process to nitride the surface of the dielectric layer having a high dielectric constant.

2. The semiconductor process according to claim 1, wherein the step of forming each metallic oxide layers comprises:
performing an atomic layer deposition process.

3. The semiconductor process according to claim 2, wherein forming each metallic oxide layer comprises:
performing an oxygen containing process to provide OH-bonds; and
performing a deposition process to form the metallic oxide layer.

4. The semiconductor process according to claim 3, wherein the oxygen containing process comprises a vapor importing process, a chloridizing and water importing process, a decoupled plasma oxidation and water importing process or an ozone importing process.

5. The semiconductor process according to claim 4, wherein the processing time of the vapor importing process is 10 seconds.

6. The semiconductor process according to claim 5, wherein the metallic oxide layer comprises a hafnium oxide layer and performing the deposition process comprises importing hafnium tetrachloride and water to form the hafnium oxide layer.

7. The semiconductor process according to claim 1, wherein the metallic oxide layer comprises a hafnium oxide layer.

8. The semiconductor process according to claim 1, wherein the processing temperature of the oxygen containing annealing process is 200° C. ~300° C.

9. The semiconductor process according to claim 1, wherein steps (a) and (b) are performed repeatedly at least 20~25 cycles.

10. The semiconductor process according to claim 1, wherein the steps (a) and (b) are performed in-situ.

11. The semiconductor process according to claim 10, wherein the steps (a) and (b) are performed in a same chamber.

12. The semiconductor process according to claim 1, wherein the nitridation process comprises a decoupled plasma nitridation process.

13. The semiconductor process according to claim 1, further comprising:
after performing the nitridation process, performing a post deposition annealing process to repair defects in the dielectric layer having a high dielectric constant.

14. The semiconductor process according to claim 13, wherein the post deposition annealing process comprises an oxygen containing annealing process performed at 900° C.

15. The semiconductor process according to claim 1, wherein the annealing process further comprises a nitrogen containing annealing process performed before the oxygen containing annealing process is performed.

16. A semiconductor structure, comprising:
a substrate; and
a dielectric layer having a high dielectric constant disposed on the substrate, wherein the dielectric layer having a high dielectric constant comprises a plurality of metallic oxide layers and an annealing interface is between each of the metallic oxide layers, and nitrogen atoms are concentrated on a surface of the dielectric layer having a high dielectric constant, wherein boundaries are within every metallic oxide layers and the boundaries between each metallic oxide layer are discontinuous.

17. The semiconductor structure according to claim 16, wherein each metallic oxide layers comprises a hafnium oxide layer.

\* \* \* \* \*